US007794630B2

(12) United States Patent
Cattaneo et al.

(10) Patent No.: US 7,794,630 B2
(45) Date of Patent: Sep. 14, 2010

(54) LITHIUM DISPENSER FOR LITHIUM EVAPORATION

(75) Inventors: Lorena Cattaneo, Busto Arsizio VA (IT); Simona Pirola, Carugate MI (IT); Chiharu Maeda, Tokyo (JP); Antonio Bonucci, Milan MI (IT)

(73) Assignee: Saes Getters S.p.A., Lainate MI (IT)

( * ) Notice: Subject to any disclaimer, the term of this patent is extended or adjusted under 35 U.S.C. 154(b) by 0 days.

(21) Appl. No.: 12/572,640

(22) Filed: Oct. 2, 2009

(65) Prior Publication Data

US 2010/0021623 A1 Jan. 28, 2010

Related U.S. Application Data

(62) Division of application No. 11/570,816, filed as application No. PCT/IT2005/000509 on Sep. 6, 2005, now Pat. No. 7,625,505.

(30) Foreign Application Priority Data

Sep. 10, 2004 (IT) .......................... MI2004A1736

(51) Int. Cl.
 *H01B 1/02* (2006.01)
 *H01B 1/08* (2006.01)
 *B05D 5/12* (2006.01)

(52) U.S. Cl. .................. 252/518.1; 252/181.4; 221/152; 222/3; 222/145.1; 222/146.2; 222/146.5; 493/52; 427/126.3

(58) Field of Classification Search ................ 252/500, 252/181.4, 518.1; 118/718; 427/70, 248.1; 445/51; 221/152; 222/3, 145.1, 146.2, 146.5; 493/52
See application file for complete search history.

(56) References Cited

U.S. PATENT DOCUMENTS

| | | | |
|---|---|---|---|
| 2,117,735 A | 5/1938 | Lester | |
| 2,424,512 A | 7/1947 | Stauffer | |
| 2,948,635 A * | 8/1960 | Koller | ......................... 427/70 |
| 3,096,211 A | 7/1963 | Davis | |
| 3,578,834 A | 5/1971 | Della Porta et al. | |
| 3,579,459 A | 5/1971 | Della Porta et al. | |
| 3,598,384 A | 8/1971 | Zucchinelli | |
| 3,658,713 A * | 4/1972 | Yorikatsu et al. ......... 252/181.4 |
| 3,663,121 A | 5/1972 | Della Porta et al. | |

(Continued)

FOREIGN PATENT DOCUMENTS

EP 0845924 A2 6/1998

(Continued)

OTHER PUBLICATIONS

F.J. Esposito et al., "Simple Source of LI Metal for Evaporators in Ultrahigh Vacuum (UHV) Applications", Journal of Vacuum Science Technology, pp. 3245-3247, vol. 12, No. 6, (1994).

*Primary Examiner*—Mark Kopec
*Assistant Examiner*—Khanh Tuan Nguyen
(74) *Attorney, Agent, or Firm*—Panitch Schwarze Belisario & Nadel LLP

(57) ABSTRACT

Mixtures are provided of lithium salts with reducing agents for lithium evaporation. The mixtures may be particularly used in the manufacture of electroluminescent organic displays. Lithium dispensers based on the use of these mixtures are also provided.

12 Claims, 3 Drawing Sheets

U.S. PATENT DOCUMENTS

| | | | |
|---|---|---|---|
| 3,742,185 A | 6/1973 | Parks | |
| 4,195,891 A | 4/1980 | Hellier | |
| 4,233,936 A | 11/1980 | Longsderff et al. | |
| 4,306,887 A | 12/1981 | Barosi et al. | |
| 4,888,052 A | 12/1989 | Harris et al. | |
| 5,543,021 A | 8/1996 | Yazami et al. | |
| 5,636,302 A | 6/1997 | Ortiz, Jr. et al. | |
| 6,013,384 A | 1/2000 | Kido et al. | |
| 6,255,774 B1 | 7/2001 | Pichler | |
| 6,540,974 B2 | 4/2003 | Misra et al. | |
| 6,753,648 B2 | 6/2004 | Boffito et al. | |
| 2002/0017245 A1* | 2/2002 | Tsubaki et al. | 118/718 |
| 2002/0193040 A1* | 12/2002 | Zhou | 445/51 |
| 2003/0073001 A1 | 4/2003 | Barker et al. | |
| 2004/0001916 A1* | 1/2004 | Boffito et al. | 427/248.1 |
| 2004/0206205 A1 | 10/2004 | Boffito et al. | |
| 2006/0032558 A1 | 2/2006 | Holloway | |
| 2006/0049755 A1 | 3/2006 | Watanabe et al. | |
| 2006/0055322 A1 | 3/2006 | Sugiyama et al. | |
| 2006/0152154 A1 | 7/2006 | Sugiyama et al. | |

FOREIGN PATENT DOCUMENTS

| | | |
|---|---|---|
| EP | 0949696 A2 | 10/1999 |
| EP | 1521286 A1 | 4/2005 |
| JP | 09-078058 A | 3/1997 |
| JP | 2004-164992 A | 6/2004 |
| WO | 2004-066337 A1 | 8/2004 |
| WO | 2004-066338 A1 | 8/2004 |
| WO | 2004-066339 A1 | 8/2004 |
| WO | 2006-057021 A1 | 6/2006 |

* cited by examiner

LITHIUM DISPENSER FOR LITHIUM EVAPORATION

CROSS-REFERENCE TO RELATED APPLICATIONS

This application is a divisional of U.S. patent application Ser. No. 11/570,816, filed Dec. 18, 2006, now allowed, which was a Section 371 of International Application No. PCT/IT2005/000509, filed Sep. 6, 2005, which was published in the English language on Mar. 16, 2006 under International Publication No. WO 2006/027814 A2, now U.S. Pat. No. 7,625,505, the disclosure of which is incorporated herein by reference.

DETAILED DESCRIPTION OF THE INVENTION

The present invention relates to mixtures to be employed for lithium evaporation in industrial applications requiring the same, as well as to lithium dispensers using these mixtures.

Lithium has been employed for a long time in the electronics field. In particular, this metal has been used in the past for the production of photo-sensitive surfaces, such as image intensifiers or photo-multiplying tubes. Another important use of lithium, in the form of alloys or salts, is in the formation of battery elements.

A new field of application of lithium is in OLED ("Organic Light Emitting Display") screens. Due to the importance of this application, reference will be made in the following in particular to this field, but the invention has a more general applicability.

In brief, an OLED is formed of a first planar transparent support (made of glass or plastics); a second support not necessarily transparent, that can be made of glass, metal or plastics, essentially planar and parallel to the first support and fixed along the perimeter thereof, so as to form a closed space; and an active structure in the space for the image formation. In turn, the active structure is formed of a first series of transparent, linear and mutually parallel electrodes, generally having anodic functionality, being deposited on the first support; a multilayer of different electroluminescent organic materials, deposited on the first series of electrodes and comprising at least one layer of a material conductor of electrons and one layer of a material conductor of electronic vacancies; and a second series of linear and mutually parallel electrodes orthogonally oriented with respect to those of the first series and having cathodic functionality, being in contact with the opposite side of the multilayer of organic materials, so that the latter is comprised between the two series of electrodes. For a more detailed explanation of the structure and the operating principle of OLED screens reference can be made, for example, to European patent application publications EP 0 845 924 A and EP 0 949 696 A, Japanese patent application publication JP 9-078058 A, and U.S. Pat. No. 6,013,384.

Recently, it has been found that the addition of small quantities of electron-donor materials to the OLEDs structure allows reduction of the potential difference to be applied to the two series of electrodes for the functioning of the screens and therefore the energy consumption of these. In particular, U.S. Pat. No. 6,013,384 discloses the use of these metals for doping of one or more layers of the organic multilayer, while U.S. Pat. No. 6,255,774 discloses the formation of very thin layers (less than 5 nanometers) between the cathodes and the contiguous organic layer. As is clear from reading these two patents (particularly from the examples), an element especially suitable for this purpose is lithium, probably due to its small dimensions allowing the production of particularly thin, continuous layers or due to its dispersion in organic matrices.

Due to its high reactivity with atmospheric gases and moisture, lithium (as any alkali metal) generally is not industrially employed in the form of pure metal, but rather in the form of compounds that are stable in air at room temperature. Most generally used compounds are the dichromate, $Li_2Cr_2O_7$, or more commonly the chromate $Li_2CrO_4$, in admixture with a reducing agent. By heating these mixtures at temperatures generally higher than 500° C., a reaction takes place by which chromium is reduced to a lower valence with the consequence of liberating lithium as a vapor. As reducing agents aluminum, silicon or getter alloys, i.e., titanium- or zirconium-based alloys with aluminum or one or more transition elements, are generally used. The use of these mixtures is disclosed for example in U.S. Pat. Nos. 2,117,735 and 3,578,834. The mixtures are generally used at the inside of suitable dispensers capable of retaining solid particles, but having at least a portion of their surface permeable to the vapors of the alkali metal, such as shown in U.S. Pat. Nos. 3,579,459 and 4,233,936.

However, chromates and dichromates of alkali metals have the disadvantage of containing hexavalent chromium, which can cause irritation by contact, swallowing or inhalation and can be carcinogenic in case of long exposures.

To avoid the use of chromium salts, it has been proposed to utilize lithium alloys, such as with aluminum. An example of the use of such alloys is given in the article F. J. Esposto et al., "Simple source of Li metal for evaporators in ultrahigh vacuum (UHV) applications," *J. Vac. Sci. Technol.*, 12(6): 3245-7 (1994). Another example of a similar application is given in Japanese patent application publication JP 2004-164992. However, employing these alloys is troublesome owing to the very irregular properties of lithium evaporation, with sudden emissions of metal, which make them essentially unusable in industrial production.

International patent application publications WO 2004/066337 A1, WO 2004/066338 A1 and WO 2004/066339 A1 describe, respectively, the use of tungstates, molybdates and vanadates of alkali metals for the release of these alkali metals, without however specifically describing or referring to lithium salts.

BRIEF SUMMARY OF THE INVENTION

An object of the present invention is to provide mixtures for lithium evaporation, which overcome the problems of the prior art.

Another object of the present invention is to provide lithium dispensers employing these mixtures.

These and additional objects are achieved by using mixtures of a lithium salt and a reducing agent, characterized in that the lithium salt is chosen among the titanate ($Li_2TiO_3$), tantalate ($LiTaO_3$), niobate ($LiNbO_3$), tungstate ($Li_2WO_4$) and zirconate ($Li_2ZrO_3$).

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
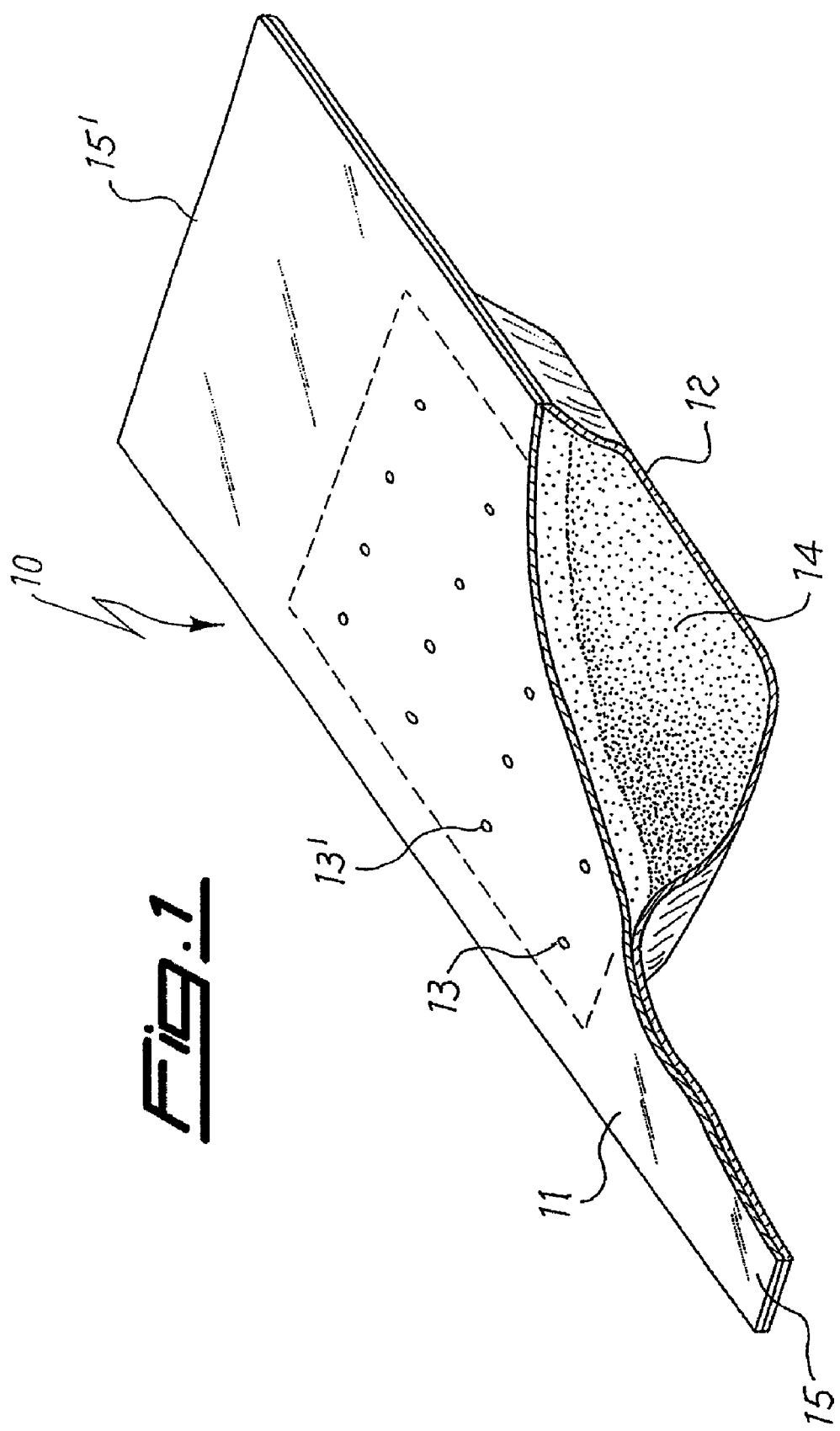
FIG. 1 is a perspective, partially cut-away section of a possible lithium dispenser according to the invention.

The inventors have found that mixtures of one or more reducing agents with a lithium salt chosen among the above-mentioned ones, not only eliminate the necessity of making recourse to compounds of hexavalent chromium, but also have additional properties that render advantageous their industrial utilization. First, the features (in particular the speed) of lithium evaporation can be easily controlled and reproduced. Furthermore, the mentioned lithium salts are much less hygroscopic than the chromium salts, thus reducing the risk that moisture may also evaporate during the lithium evaporation, which is extremely dangerous for the OLED's functioning. Among the cited salts the preferred one is the titanate, because it is the one showing the highest percentage content of lithium by weight, and also because in the tests carried out by the inventors it has been found that this salt is the one requiring the slightest energy quantity for its evaporation. Besides, it has been observed that lithium titanate gives rise to a particularly smooth lithium evaporation, which is thus easily controllable.

U.S. Pat. No. 6,753,648 B2, in the name of SAES Getters S.p.A., describes salts similar to those of the present invention for the evaporation of cesium. However, owing to the difference of chemical characteristics between lithium and cesium (due to the particularly reduced dimensions and the high polarizability of the ion $Li^+$ with respect to $Cs^+$), the teachings of the cited U.S. patent cannot be applied directly to the case of lithium. For example, the molybdate anion forms with cesium a salt useful for evaporation of the alkali metal, whereas with lithium it forms a salt giving rise to sudden and uncontrollable evaporations, unsuitable in industrial applications. In contrast, cesium titanate is useless in practice, because it is excessively hydroscopic, whereas lithium titanate has turned out to be the preferable salt for lithium evaporation.

The reducing agent employed in the mixtures of the invention can be one of the already known components employed in the dispensers based on chromates, such as aluminum, silicon, zirconium or titanium, or alloys containing zirconium or titanium, such as the alloy of percent composition by weight Zr 84%-Al 16%, manufactured and sold by SAES Getters S.p.A. under the mark St 101®, or the alloy having the weight composition Zr 76.5%-Fe 23.5%, manufactured and sold by SAES Getters S.p.A. under the mark St 198®. It is also possible to use a mixture of a plurality of reducing agents.

In order to enhance the contact between the compound of lithium and the reducing agent, these are preferably employed in a powdered form. Both the mixture components generally have particle sizes of less than 1 mm and preferably less than 500 µm. Still more preferably the particle size is comprised between about 10 and 125 µm. Powders with particles having a size of less than 10 µm are generally difficult to be treated in manufacturing and to be kept inside the dispenser. Furthermore, in case of the reducing agent, excessively fine powders can become pyrophoric, giving rise to safety problems in the manufacturing plant. In contrast, with powders with particle sizes greater than those indicated, the contact between the two components of the mixtures becomes worse, and the reaction leading to lithium evaporation slows down.

The weight ratio between the lithium salt and the reducing agent can vary within wide limits. Preferably, such a ratio is comprised between 10:1 and 1:10. The use of the lithium salt in great excess with respect to the reducing agent offers no practical advantage. Conversely, especially when the reducing agent is a getter alloy, such as the cited St 101® alloy, an excess thereof in the mixture can be useful, because the portion not involved in the reaction with the lithium salt can have the effect of sorbing gases, which may be liberated during the reaction. A preferred weight ratio between the lithium salt and the reducing agent is 1:5.

The mixture can be used in the form of loose powders. Preferably, however, it is used in the form of pellets, having the advantage of further improving the contact between the mixture components and facilitating the operations of loading the container. Another advantage of pellets as compared to powders, that has been observed by the inventors, is that pellets require a lesser amount of energy for lithium evaporation, and lithium load of the mixture is used more thoroughly, as described in greater detail by a test in the Examples below.

The container can be made of any material and shape compatible with the application. In particular, as far as the material is concerned, this should be chemically inert against the processing atmosphere and the lithium dispensing mixture at any temperature foreseen in use, which can exceed 1000° C. Furthermore, at the temperatures of use the material forming the container should not undergo substantial physical alterations, such as modifying either its mechanical strength or shape, and must show as low as possible values of gas emission. Materials having these features are, for example, metals or metallic alloys, a few ceramics or graphite. Employing metals and alloys is preferred due to their easier workability and formability. Another advantage in the use of metals and alloys is that the dispenser can be heated to the temperature of lithium evaporation simply by flowing current through the container walls. Preferred metals and alloys for making the container are molybdenum, tantalum, tungsten, nickel, steel and nickel—chromium or nickel—chromium—iron alloys.

The shape of the container can be any whatsoever among those known from U.S. Pat. Nos. 3,578,834; 3,579,459; 3,598,384; 3,636,302; 3,663,121; 4,233,936; and 6,753,648 B2. Containers of various shapes and materials are also available in the trade, for instance from the Austrian company Plansee or the U.S. company Midwest Tungsten Service. A first possible shape of dispenser of the invention is shown in FIG. 1. The dispenser 10 consists of a container with a mixture 14 of the invention inside. The container is formed by the assembly of an upper part 11 and a lower part 12; the two parts preferably being made of metal and joined to each other, e.g. by spot-welding. The lower part shows in its central zone a recess (obtained, e.g., by cold stamping), having housed therein a mixture of the invention, while the upper part has a number of openings 13, 13', . . . , to allow the emission of lithium vapors. In the drawing the area of part 11 defined by dashed lines corresponds to the recess in part 12. The mixture of the invention can be present in the recess of part 12 in powder form, as shown in the drawing, wherein the mixture is illustrated as element 14. Alternatively, it is possible to form pellets of the mixture and fill the recess therewith. Dispenser 10 has at its two ends "wings" 15 and 15', which are particularly adapted for connection with electrical terminals for heating the dispenser by direct current flow.

Figure 2:
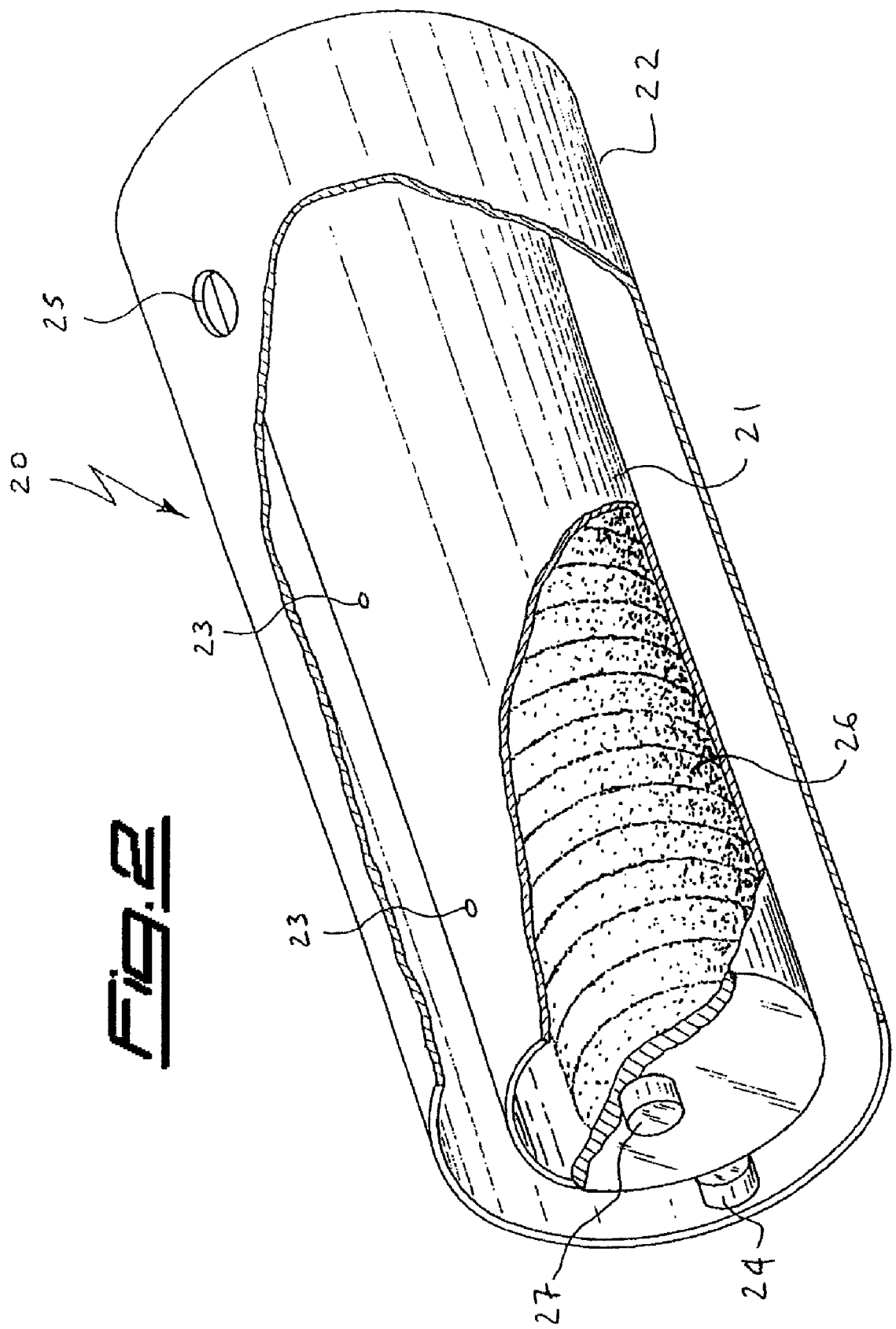
FIG. 2 is a perspective, partially cut-away section of a preferred embodiment of lithium dispenser according to the invention.

Another possible shape of dispenser is shown in FIG. 2. This container is the object of, and is described in greater detail in, Italian patent application No. MI2004A002279. The dispenser 20 is formed of a central container 21 and a shield 22. Container 21 is closed apart from openings 23. In the drawing the case is represented where the container has three openings, one of which is hidden by the shield, but these could be present in any number. Shield 22 is concentrically arranged around container 21, and kept in the correct position by spacers 24 (only one shown). The shield has openings 25 at positions radially corresponding to openings 23. In the container the mixture of the invention is present with a lithium salt and a reducing agent. The mixture is represented in this case as a plurality of pellets 26, laid in the bottom of the container one next to another. Evaporation of lithium is caused by heating the container, for instance by feeding current to the ends thereof through contacts 27 (only one shown).

The invention will be further illustrated by the following examples.

EXAMPLE 1

A container like the one shown in FIG. 1 is manufactured by employing sheets of Inconel (an alloy mainly comprising nickel-chromium, plus minor amounts of other metals) having a thickness of 0.2 mm. The container has lateral dimensions of 100×24 mm, with a recess 6 mm high being filled up with about 10 g of a mixture of the cited alloy St 101® and $Li_2TiO_3$ in a weight ratio of 5:1. The mixture is employed in the form of pellets having a diameter of 6 mm and a height of 3 mm, being obtained by compression of the powder mixture under a pressure of about 1700 Kg.

The dispenser is placed on the bottom of an evacuated chamber, and a small glass plate of lateral dimensions 3×3 cm is placed above the dispenser at a distance of about 20 cm. To the ends of the container ("wings" 15, 15' in FIG. 1) is applied a direct current of 100 A over about six hours. The current flow heats the dispenser up to a temperature of about 800° C., thus causing the reaction between the mixture components and lithium evaporation. A fraction of the evaporated lithium condenses on the glass plate forming a thin film thereon.

During the test the chamber is connected to a sample line of a mass spectrometer (MS) for monitoring the quantities of emitted gases during the evaporation (obviously except for lithium since due to condensation onto the cold walls of the chamber, this element is not sent to the MS measurement). No substantial gas emissions are observed during the whole test.

At the end of the test the quantity of evaporated lithium is estimated by measuring the weight difference of the dispenser before and after the test. By taking into account the results of the in-line MS measurement, the weight difference is completely ascribed to the lithium evaporation, thus resulting in a metal evaporation of 100%.

An analysis of the film formed on the glass plate is also carried out to check its purity, by dissolving it in a HCl solution and chemically analyzing the thus obtained solution through atomic absorption. The film contains a quantity of impurities lower than 1% by weight.

In the chamber near the glass plate there is also mounted a quartz crystal monitor (QCM), a device well known in the field to measure the growing speed of thin films by exploiting the variation of the quartz crystal vibration frequency as a function of the weight of material deposited thereon. From the knowledge of density and acoustic impedance of metallic lithium, the weight increase is correlated to the increase of film thickness with time, thus obtaining a constant speed of film deposition with a value of about 0.2 Ångstrom per second (Å/s).

EXAMPLE 2

A lithium dispenser like the one shown in FIG. 2 is prepared, comprising a cylindrical central container and a shield, both made of stainless steel of 0.2 mm thickness. The container is 10 cm long and has a diameter of 3.1 cm, with two holes of 2.5 mm diameter spaced 5 cm apart along a line on its upper part. The shield, concentrically arranged around the container, is as long as the container and has a diameter of 3.4 cm, with four holes of 11 mm diameter, two holes facing the holes in the container surface, and the other two holes placed between the first two holes and spaced 12 mm apart from each other. The container is filled with 110 g of a mixture of the cited alloy St 101® and $Li_2TiO_3$ in a weight ratio of 1:1. The mixture is employed in the form of loose powders.

The dispenser is placed on the bottom of an evacuated chamber and heated by feeding direct current to the ends of the central container, thus causing lithium evaporation. The test lasts about 40 hours. A QCM is present in the chamber at a distance of 36 cm from the dispenser to measure the speed of growth of a lithium film, which is proportional to the rate of evaporation of the lithium metal from the dispenser. The QCM is connected via a feed-back loop to the power source, and the system is regulated to obtain a growth speed of 0.28 Å/s. As evaporation proceeds, the amount of lithium left in the dispenser decreases, and the temperature required to keep the rate of evaporation increases. This implies a demand for higher power, and thus a higher value of current with time, up to a maximum current value of 300 A (the limit value the system can supply).

Figure 3:
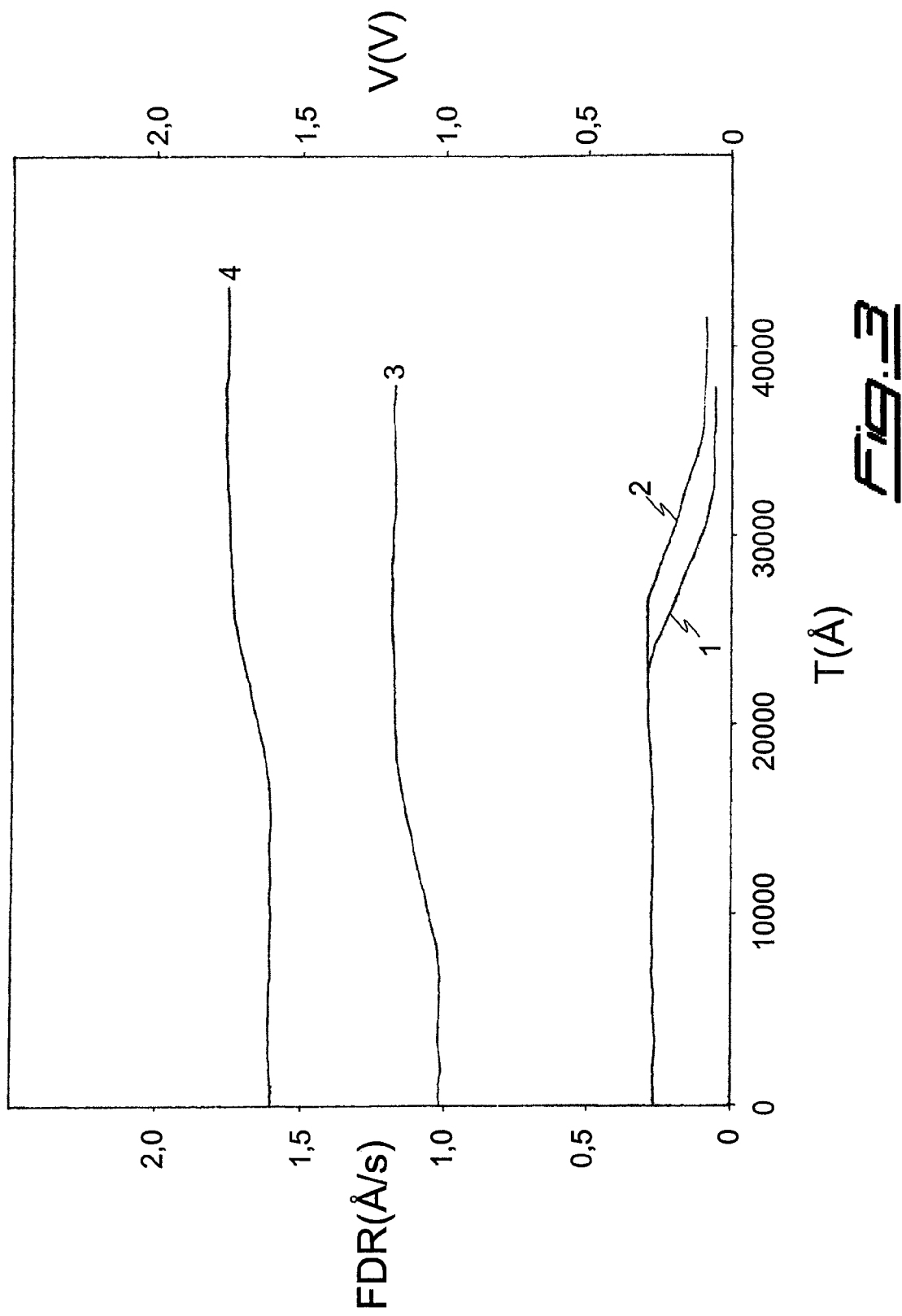
FIG. 3 is a graph illustrating lithium evaporation properties of dispensers using mixtures of the invention.

In FIG. 3 are reported the results of this test: curve 1 represents the trend of film deposition rate (FDR, measured in Å/s, on the left-hand axis of the graph) as a function of the thickness of lithium film deposited (T, measured in Å); curve 2 represents the trend of the voltage measured at the ends of the dispenser during the test (Volts, V, right-hand axis of the graph).

EXAMPLE 3

The test of example 2 is repeated, with the only difference that in this case the lithium dispensing mixture is present in the form of x pellets having a diameter of 6 mm and a height of 3 mm, each one of about 0.3 g in weight, obtained by compression of the mixture of powders under a pressure of about 1700 Kg.

The results of this test are reported in FIG. 3. Curve 3 represents the trend of evaporation rate, while curve 4 represents the trend of the voltage measured at the ends of the dispenser during the test. Curve 2 is essentially superimposed to curve 1 all along the test, apart from the end tail where a difference in the behavior of dispensers charged with powders or pellets is observed.

As observed in the tests of the Example (in particular Example 1), the mixtures of the invention are suitable for use in industrial processes, as they show constant features of metal evaporation without sudden phenomena, they do not give rise to substantial emissions of potentially harmful gases (such as water), and they allow growth of lithium thin films of high purity in a reproducible way and at a constant speed. A comparison of results obtained in Examples 2 and 3 shows that, while both powders and pellets are suitable for the purposes of the dispensers of the invention, dispensers charged with pellets may be preferable as these allow evaporation of lithium for a longer time at a constant evaporation rate (up to a film thickness of about 25800 Å obtained with pellets, curve 2 in FIG. 3, vs. a thickness of about 22350 Å obtained with powders, curve 1 in FIG. 3). The reason for this behavior has not been fully clarified yet, but it is believed that, at the operative temperatures for lithium evaporation, loose powders have a better surface contact than pellets and thus behave as better electrical conductors. As a consequence, when electricity flows across powders, less heat is generated compared to pellets, with the overall effect that using powders a higher current is required to heat the mixture to the temperature values effective to cause lithium evaporation. This interpretation seems to be confirmed by the two curves 3 and 4 in FIG. 3, showing a high voltage drop at the ends of the dispenser charged with pellets as compared to the one charged with loose powders, throughout the test.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A lithium dispenser (10;20) containing a mixture for lithium evaporation, comprising a lithium salt and a reducing agent wherein the lithium salt is selected from titanate ($Li_2TiO_3$), tantalate ($LiTaO_3$), niobate ($LiNbO_3$), and zirconate ($LiZrO_3$), and the reducing agent is selected from aluminum, silicon, zirconium, titanium, and an alloy of zirconium or titanium.

2. The lithium dispenser according to claim 1, wherein the mixture is in powder form having particle sizes of less than 1 mm.

3. The lithium dispenser according to claim 1, wherein the dispenser comprises a metallic container provided with at least one opening (13, 13'; 23, 25) for the emission of lithium vapors.

4. The lithium dispenser according to claim 1, wherein the dispenser comprises a container comprising a metal, a metallic alloy, a ceramic, or graphite.

5. The lithium dispenser according to claim 1, wherein the dispenser comprises a container comprising at least one material selected from the group consisting of molybdenum, tantalum, tungsten, nickel, steel, a nickel-chromium alloy, and a nickel-chromium-iron alloy.

6. The lithium dispenser according to claim 1, wherein a weight ratio of the lithium salt and the reducing agent is between 10:1 and 1:10.

7. The lithium dispenser according to claim 1, wherein the mixture is compressed in a form of pellets.

8. A method of forming a thin lithium film on a substrate, comprising heating the mixture contained in the lithium dispenser according to claim 1 to evaporate lithium from the lithium salt to form the thin lithium film on the substrate.

9. The method according to claim 8, wherein the evaporation is performed under vacuum.

10. The method according to claim 8, wherein the heating is performed at a temperature higher than 500° C.

11. The method according to claim 8, wherein the substrate is an electrode.

12. The method according to claim 8, wherein the substrate is a multilayer comprising electroluminescent organic materials.

* * * * *